United States Patent
Mori et al.

(10) Patent No.: US 9,743,515 B2
(45) Date of Patent: Aug. 22, 2017

(54) RESIN COMPOSITION, PREPREG AND METAL-FOIL-CLAD LAMINATE

(75) Inventors: Kenichi Mori, Tokyo (JP); Shoichi Ito, Tokyo (JP)

(73) Assignee: MITSUBISHI GAS CHEMICAL COMPANY, INC., Tokyo (JP)

(*) Notice: Subject to any disclaimer, the term of this patent is extended or adjusted under 35 U.S.C. 154(b) by 821 days.

(21) Appl. No.: 12/385,194

(22) Filed: Apr. 1, 2009

(65) Prior Publication Data

US 2009/0247032 A1 Oct. 1, 2009

(30) Foreign Application Priority Data

Apr. 1, 2008 (JP) ................................ 2008-094858
Nov. 14, 2008 (JP) ................................ 2008-292281

(51) Int. Cl.
*H05K 1/03* (2006.01)
*C08G 65/48* (2006.01)
*C08L 71/12* (2006.01)
*C08L 67/00* (2006.01)
*C08L 65/00* (2006.01)
*C08L 63/00* (2006.01)
*C08K 7/20* (2006.01)
*C08K 3/36* (2006.01)
*C08L 69/00* (2006.01)

(52) U.S. Cl.
CPC ......... *H05K 1/0373* (2013.01); *C08G 65/485* (2013.01); *C08L 71/126* (2013.01); *C08K 3/36* (2013.01); *C08K 7/20* (2013.01); *C08L 63/00* (2013.01); *C08L 65/00* (2013.01); *C08L 67/00* (2013.01); *C08L 69/00* (2013.01); *H05K 2201/012* (2013.01); *H05K 2201/0209* (2013.01); *Y10T 428/31678* (2015.04); *Y10T 442/30* (2015.04)

(58) Field of Classification Search
CPC ........... H05K 1/0373; H05K 2201/012; H05K 2201/0209; C08G 65/485; C08L 71/126; C08L 67/00; C08L 65/00; C08L 63/00; C08L 69/00; Y10T 442/30; Y10T 428/31678; C08K 7/20; C08K 3/36
USPC ........ 428/292.1, 297.4, 457–472.3; 524/500; 442/136, 146, 181, 180
See application file for complete search history.

(56) References Cited

U.S. PATENT DOCUMENTS

| | | | |
|---|---|---|---|
| 5,352,745 A * | 10/1994 | Katayose | C08F 290/142 428/461 |
| 6,586,533 B1 * | 7/2003 | Landi et al. | 525/315 |
| 7,192,651 B2 | 3/2007 | Ohno et al. | |
| 2002/0058778 A1 * | 5/2002 | Konarski et al. | 528/94 |
| 2005/0042466 A1 | 2/2005 | Ohno et al. | |
| 2006/0084787 A1 | 4/2006 | Sugano et al. | |

FOREIGN PATENT DOCUMENTS

| | | |
|---|---|---|
| CN | 100497485 | 6/2009 |
| CN | 1803916 | 10/2010 |
| EP | 1 566 377 | 8/2005 |
| JP | 2005-89636 | 4/2005 |
| JP | 2005-112981 | 4/2005 |
| JP | 2005-120173 | 5/2005 |
| JP | 2005-264154 | 9/2005 |
| JP | 2007-277334 | 10/2007 |

OTHER PUBLICATIONS

Machine Translation of JP 2005-089636, "Prepreg for Laminated Sheet and Laminated Sheet", Published Apr. 7, 2005, found at http://www4.ipdl.inpitgo.jp/Tokujitu/PAJdetail.ipdl?N0000=60&N0120=01&N2001=2&N3001=2005-089636.*
European Search Report dated Oct. 6, 2009 in European Application No. EP 09 25 0984.
Office Action issued Nov. 6, 2013 in corresponding Taiwanese Application No. 098110827, with English translation thereof.

* cited by examiner

*Primary Examiner* — Frank Vineis
(74) *Attorney, Agent, or Firm* — Wenderoth, Lind & Ponack, L.L.P.

(57) ABSTRACT

A vinyl-compound-based resin composition containing a terminal vinyl compound (a) of a bifunctional phenylene ether oligomer having a polyphenylene ether structure, a naphthol aralkyl cyanate ester resin (b), a bisphenol A cyanate ester resin (c), a brominated flame retardant (d) and an inorganic filler (e). The resin composition is for use in a printed wiring board for high multilayer and high frequency, and is excellent in moldability, electric characteristics, peel strength, flame resistance and heat resistance after moisture absorption. Further, a prepreg comprising the above resin composition and a glass woven fabric, a metal-foil-clad laminate obtained by disposing a metal foil on one side or both sides of a stack of at least one prepreg and laminate-molding the resultant set, and a resin sheet obtained by applying a solution of the above resin composition to a surface of a metal foil or a film.

7 Claims, No Drawings

RESIN COMPOSITION, PREPREG AND METAL-FOIL-CLAD LAMINATE

FIELD OF THE INVENTION

The present invention relates to a resin composition excellent in moldability, electric characteristics, peel strength, flame resistance and heat resistance after moisture absorption and to a prepreg and a metal-foil-clad laminate each of which uses the resin composition. The resin composition is suitably used for a mother board and a semiconductor plastic package having a semiconductor chip mounted thereon, as a resin composition for use in a printed wiring board coping with lead-free soldering reflow, high frequency and high multilayer.

BACKGROUND ARTS

Recently, an information terminal apparatus such as a personal computer or a server and a telecommunications apparatus such as an internet router or optical communication are required to process mass data at high speed so that an increase in the speed and frequency of an electric signal has taken place. Accordingly, with regard to a laminate for a printed wiring board to be used for these apparatuses, a decrease in a dielectric constant and a decrease in a dielectric loss tangent are required in order to cope with a demand for high frequency. In particular, a decrease in a dielectric loss tangent is required. In order to meet these demands, a fluororesin, a cyanate ester resin (for example, see JP-A-2005-120173), a polyphenylene ether resin (for example, see JP-A-2005-112981) and a vinyl compound composed mainly of styrene (for example, see JP-2005-89636) are conventionally known concerning a laminate for high frequency uses. A material using the cyanate ester resin, the polyphenylene ether resin or the vinyl compound, which is used for a high multilayer board for high frequency uses, has the following problems. That is, a problem thereof is that a crack occurs on a wall surface of a through hole at a drilling time since the resin is rigid and fragile. Another problem thereof is that there is a problem about moldability since the molecular weight of the resin is large. Further, these resins are insufficient in copper foil adhesive strength because of their nonpolarity (for example, see JP-2005-89636 and J-A-6-207096).

SUMMARY OF THE INVENTION

It is an object of the present invention to provide a vinyl-compound-based resin composition for use in a printed wiring board for high multilayer and high frequency, which resin composition is improved in moldability and copper foil peel strength, which are conventional problems, without any decrease in electric characteristics and heat resistance after moisture absorption while keeping flame retardancy, and a prepreg, a metal-foil-clad laminate and a resin sheet, each of which uses the above resin composition.

The present inventors have made diligent studies for attaining the above object and as a result found that, when a resin composition obtained by incorporating two kinds of specific cyanate ester resins into a terminal vinyl compound of a bifunctional phenylene ether oligomer having a specific polyphenylene ether structure is used in combination with a brominated flame retardant and an inorganic filler, the resultant resin composition maintains flame retardancy and is improved in both moldability and peel strength without any decrease in heat resistance after moisture absorption and electric characteristics. On the basis of the above finding, the present inventors have arrived at the present invention.

That is, the present invention provides a resin composition containing a terminal vinyl compound (a) of a bifunctional phenylene ether oligomer having a polyphenylene ether structure, a naphthol aralkyl type cyanate ester resin (b), a bisphenol A cyanate ester resin (c), a brominated flame retardant (d) and an inorganic filler (e).

Further, the present invention also provides a prepreg comprising the above resin composition and a glass woven fabric (f), a metal-foil-clad laminate obtained by placing one thus-obtained prepreg or stacking at least two thus-obtained prepregs, disposing metal foil(s) on one side or both sides of the prepreg or the stacked prepregs and laminate-molding the metal foil(s) and the prepreg or the stacked prepregs, and a resin sheet obtained by applying the above resin composition to a metal foil or a film.

Effect of the Invention

A printed wiring board using the prepreg or metal-foil-clad laminate obtained from the resin composition of the present invention is improved in both moldability and peel strength without any decrease in properties such as flame retardancy, heat resistance after moisture absorption and electric characteristics. Therefore, the resin composition of the present invention is suitable for a printed wiring board material which copes with high multilayer and high frequency. Industrial utilities thereof are remarkably high.

DETAILED DESCRIPTION OF THE INVENTION

The vinyl compound (a) represented by the formula (1) used in the present invention is not specially limited so long as it is a vinyl compound which is represented by the formula (1) wherein —(O—X—O)— is a structural unit defined by the formula (2) or the formula (3) in which $R_1$, $R_2$, $R_3$, $R_7$ and $R_8$ are the same or different and represent a halogen atom, an alkyl group having 6 or less carbon atoms or a phenyl group, $R_4$, $R_5$, $R_6$, $R_9$, $R_{10}$, $R_{11}$, $R_{12}$, $R_{13}$, $R_{14}$, $R_{15}$ and $R_{16}$ are the same or different and represent a hydrogen atom, a halogen atom, an alkyl group having 6 or less carbon atoms or a phenyl group, and -A- represents a linear, branched or cyclic bivalent hydrocarbon group having 20 or less carbon atoms; —(Y—O)— represents an arrangement of one kind of a structural unit defined by the formula (4) or a random arrangement of at least two kinds of structural units defined by the formula (4) in which $R_{17}$ and $R_{18}$ are the same or different and represent a halogen atom, an alkyl group having 6 or less carbon atoms or a phenyl group and $R_{19}$ and $R_{20}$ are the same or different and represent a hydrogen atom, a halogen atom, an alkyl group having 6 or less carbon atoms or a phenyl group; and each of a and b is an integer of 0 to 100, provided that at least one of a and b is not 0. Further, at least two kinds of vinyl compounds (a), which are different from each other in terms of structure, can be contained in the resin composition of the present invention.

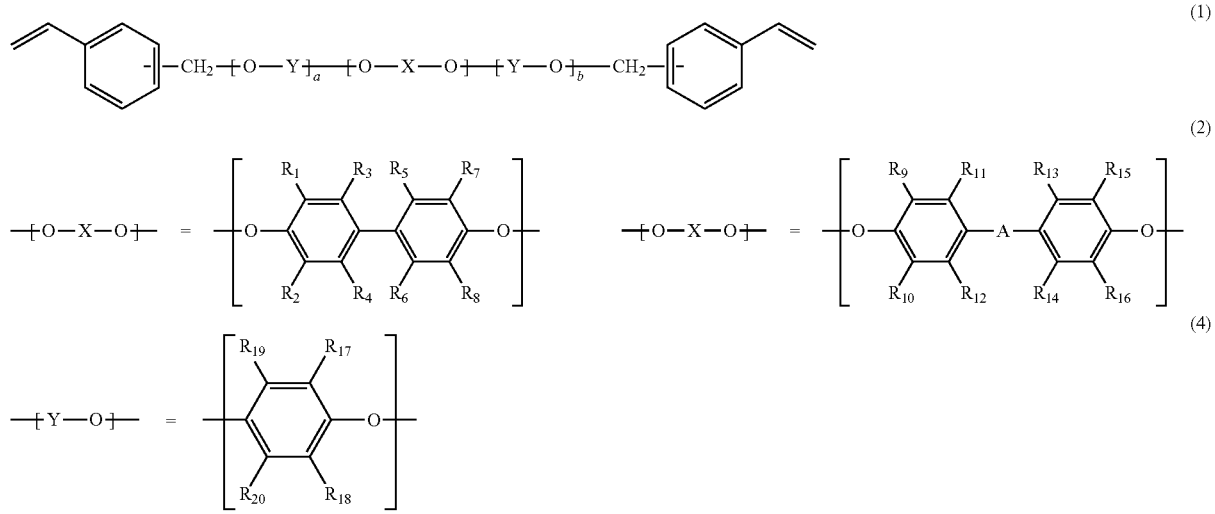

(1)

(2)

(4)

Examples of -A- in the formula (3) include bivalent organic groups such as methylene, ethylidene, 1-methylethylidene, 1,1-propylidene, 1,4-phenylenebis(1-methylethylidene), 1,3-phenylenebis(1-methylethylidene), cyclohexylidene, phenyl methylene, naphthyl methylene and 1-phenylethylidene. -A- is not limited to these examples.

Among the vinyl compounds (a) in the present invention, preferred is a vinyl compound of the formula (1) in which $R_1$, $R_2$, $R_3$, $R_7$, $R_8$, $R_{17}$ and $R_{18}$ represent an alkyl group having 3 or less carbon atoms and $R_4$, $R_5$, $R_6$, $R_9$, $R_{10}$, $R_{11}$, $R_{12}$, $R_{13}$, $R_{14}$, $R_{15}$, $R_{16}$, $R_{19}$ and $R_{20}$ represent a hydrogen atom or an alkyl group having 3 or less carbon atoms. In particular, more preferred is a vinyl compound of the formula (1) in which —(O—X—O)— represented by the formula (2) or the formula (3) is represented by the formula (6), the formula (7) or the formula (8) and —(Y—O)— represented by the formula (4) is an arrangement of a structural unit of the formula (9) or the formula (10) or a random arrangement of structural units of the formula (9) and the formula (10).

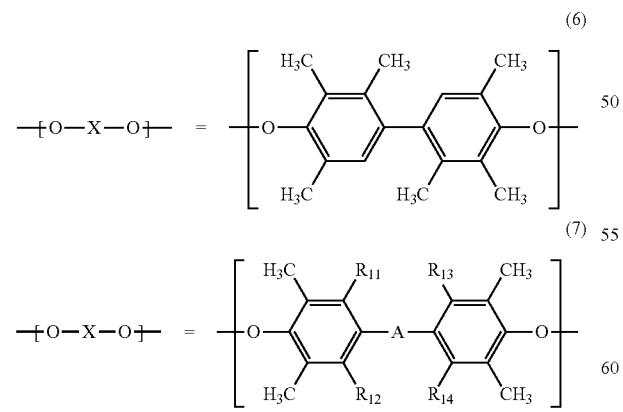

(6)

(7)

wherein $R_{11}$, $R_{12}$, $R_{13}$ and $R_{14}$ are the same or different and represent a hydrogen atom or a methyl group and -A- represents a linear, branched or cyclic bivalent hydrocarbon group having 20 or less carbon atoms.

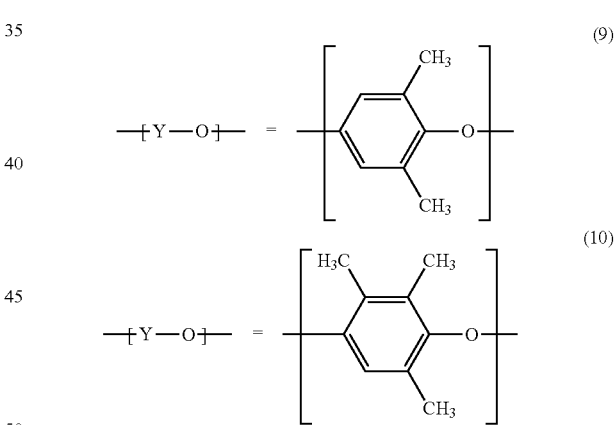

(8)

wherein -A- represents a linear, branched or cyclic bivalent hydrocarbon group having 20 or less carbon atoms.

(9)

(10)

It is preferred that the vinyl compound (a) has a number average molecular weight, calculated as polystyrene by a GPC method, of 500 to 3,000. When the number average molecular weight is smaller than 500, a coating film obtained from the resin composition is apt to be sticky. When the number average molecular weight is larger than 3,000, the solubility of the vinyl compound (a) in a solvent is decreased. The method of producing the vinyl compound (a) is not specially limited. For example, the vinyl compound (a) can be produced by vinylbenzyl etherification of a terminal phenolic hydroxyl group of a bifunctional phenylene ether oligomer obtained by oxidatively coupling a bifunctional phenol compound and a monofunctional phenol compound.

For example, the bifunctional phenylene ether oligomer can be produced by dissolving the bifunctional phenol compound, the monofunctional phenol compound and a catalyst in a solvent and then introducing oxygen into the resultant solution under heat with stirring. Examples of the bifunctional phenol compound include 2,2',3,3',5,5'-hexamethyl-(1,1'-biphenol)-4,4'-diol, 4,4'-methylenebis(2,6-dimethylphenol), 4,4'-dihydroxyphenylmethane and 4,4'-dihydroxy-2,2'-diphenylpropane. The bifunctional phenol compound is not limited to these examples. The monofunctional phenol compound is typically 2,6-dimethylphenol or 2,3,6-trimethylphenol. The monofunctional phenol compound is not limited to these. An example of the catalyst is a combination of a copper salt and an amine. Examples of the copper salt include CuCl, CuBr, CuI, $CuCl_2$ and $CuBr_2$. Examples of the amine include di-n-butylamine, n-butyldimethylamine, N,N'-di-t-butylethylenediamine, pyridine, N,N,N',N'-tetramethylethylenediamine, piperidine and imidazole. The catalyst is not limited to these. As the solvent, for example, toluene, methanol, methyl ethyl ketone and xylene can be used. The solvent is not limited to these examples.

The vinylbenzyl etherification of a terminal phenolic hydroxyl group of the bifunctional phenylene ether oligomer can be carried out by, for example, dissolving the bifunctional phenylene ether oligomer and vinylbenzyl chloride in a solvent, adding a base to the resultant solution under heat with stirring to allow the mixture to react, and then solidifying a resin. Examples of the vinylbenzyl chloride include o-vinylbenzylchloride, m-vinylbenzylchloride, p-vinylbenzylchloride and mixtures of these. The vinylbenzyl chloride is not limited to these examples. Examples of the base include sodium hydroxide, potassium hydroxide, sodium methoxide and sodium ethoxide. The base is not limited to these examples. It is possible to use an acid for the purpose of neutralizing the base which is left after the reaction. Examples of the acid include hydrochloric acid, sulfuric acid, phosphoric acid, boric acid and nitric acid. The acid is not limited to these examples. Examples of the solvent include toluene, xylene, acetone, methyl ethyl ketone, methyl isobutyl ketone, dimethylformamide, dimethylacetamide, methylene chloride and chloroform. The solvent is not limited to these examples. The method of the solidification is typically a method in which the resin is dried and solidified by evaporating the solvent or a method in which the resin is precipitated by mixing a reaction liquid with a poor solvent. The method of the solidification is not limited to these methods.

The amount of the vinyl compound (a) is preferably 30 to 95 parts by weight, especially preferably 50 to 80 parts by weight, based on 100 parts by weight of a resin solid content in the resin composition. When the amount of the vinyl compound (a) is not in the above range, there is a problem in terms of electrical characteristics or reactivity.

The naphthol aralkyl type cyanate ester resin (b) used in the present invention is not specially limited so long as it is a cyanate ester resin represented by the formula (5) or its prepolymer. The amount of the naphthol aralkyl type cyanate ester resin (b) is preferably 2 to 15 parts by weight, especially preferably 3 to 10 parts by weight, based on 100 parts by weight of a resin solid content in the resin composition. When it is not in the above range, a decrease in heat resistance after moisture absorption or peel strength or a problem of reactivity arises in some cases. The cyanate ester resin (b) represented by the formula (5) is obtained by condensation of a cyanic acid and a naphthol aralkyl resin obtained by reacting a naphthol such as α-naphthol or β-naphthol with p-xylyleneglycol, α,α'-dimethoxy-p-xylene, 1,4-di(2-hydroxy-2-propyl)benzene or the like. The method of producing the naphthol aralkyl type cyanate ester resin (b) is not specially limited. It may be produced by any known cyanate ester synthesis method. For example, specifically, the naphthol aralkyl type cyanate ester resin (b) can be obtained by reacting a naphthol aralkyl resin represented by the formula (11) with cyanogen halide in an inactive organic solvent in the presence of a basic compound. Further, the naphthol aralkyl type cyanate ester resin (b) can be also synthesized by forming a salt of a similar naphthol aralkyl resin and a basic compound in a water-containing solution and then reacting the salt with cyanogen halide in a two-phase interface reaction.

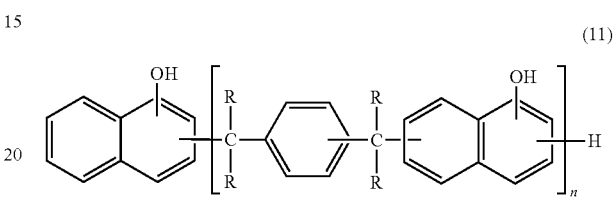

(11)

wherein R represents a hydrogen atom or a methyl group and n is 1 to 10 as an average value.

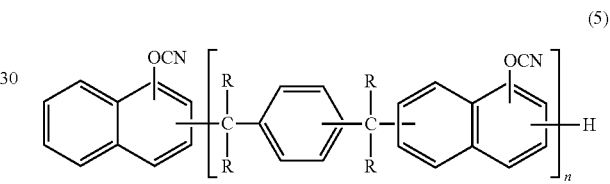

(5)

wherein R represents a hydrogen atom or a methyl group and n is 1 to 10 as an average value.

The bisphenol A cyanate ester resin (c) used in the present invention is obtained by converting two phenolic hydroxyl groups of bisphenol A into cyanate ester groups and a prepolymer thereof is also included. The amount of the bisphenol A cyanate ester resin (c) is preferably in the range of 2 to 15 parts by weight, especially preferably 3 to 10 parts by weight, based on 100 parts by weight of a resin solid content in the resin composition. When it is not in the above range, a decrease in heat resistance after moisture absorption or peel strength or a problem of reactivity arises in some cases.

The brominated flame retardant (d) used in the present invention is not specially limited so long as it is a bromine-atom-containing compound having at least two epoxy groups in a molecule or a bromine-atom-containing oligomer having a polycarbonate structure. Specific example thereof include a brominated bisphenol A type epoxy resin, a brominated phenol novolak type epoxy resin and a brominated polycarbonate oligomer. The brominated flame retardant (d) can be used singly or at least two brominated flame retardants (d) can be used in combination, as required. The molecular weight of the brominated polycarbonate oligomer is not specially limited. A brominated polycarbonate oligomer having a weight average molecular weight of 500 to 3,000 is preferred. The amount of the brominated flame retardant (d) is not specially limited. It is preferably in the range of 5 to 35 parts by weight, especially preferably 10 to 30 parts by weight, based on 100 parts by weight of a resin solid content in the resin composition. When it is smaller than the lower limit of the above range, peel strength is decreased and flame retardancy is insufficient in some cases. When it is larger than the upper limit of the above range, heat resistance and electric characteristics are largely decreased in some cases.

The inorganic filler (e) used in the present invention can be selected from general inorganic fillers for use in laminates. Specific examples thereof include silicas such as natural silica, fused silica, synthetic silica, amorphous silica and hollow silica, molybdenum compounds such as molybdenum oxide and zinc molybdate, zinc borate, zinc stannate, alumina, clay, kaolin, talc, calcined clay, calcined kaolin, calcined talc, mica, short glass fiber (fine powders of glasses such as E glass or D glass) and hollow glass. The inorganic filler (e) can be used singly or at least two inorganic fillers (e) can be used in combination as required. The average particle diameter (D50) of the inorganic filler (e) is not specially limited. In terms of dispersibility, preferred are a mesoporous silica, a spherical fused silica, a spherical synthetic silica and a hollow spherical silica, each of which has an average particle diameter (D50) of 0.1 to 3 µm. When the average particle diameter (D50) is not in the range of from 0.1 to 3 µm, a problem of flowing characteristic arises at the time of molding or a problem of breakage of a small-diameter drill bit arises during its use in some cases. The amount of the inorganic filler (e) is not specially limited. It is preferably in the range of 10 to 150 parts by weight, especially preferably 20 to 100 parts by weight, based on 100 parts by weight of a resin solid content in the resin composition. When the amount of the inorganic filler (e) is too large, moldability is decreased in some cases. Therefore, the amount of the inorganic filler (e) is especially preferably 100 parts by weight or less. The average particle diameter (D50) is obtained as follows. A predetermined amount of a powder is added to an aqueous dispersion medium. The powder is measured for particle size distribution with a laser diffraction type particle size distribution instrument. The volumes of particles are added in ascending order of size. The average particle diameter (D50) is represented by a particle diameter at 50% of the total volume of the particles.

A silane coupling agent or a wetting and dispersing agent can be jointly used together with the inorganic filler (e). The silane coupling agent is not specially limited so long as it is a general silane coupling agent which is used for the surface-treatment of an inorganic substance. Specific examples of the silane coupling agent include aminosilane coupling agents such as γ-aminopropyltriethoxysilane and N-β-(aminoethyl)-γ-aminopropyltrimethoxysilane, epoxysilane coupling agents such as γ-glycidoxypropyltrimethoxysilane, vinylsilane coupling agents such as γ-methacryloxypropyl trimethoxysilane, cationic silane coupling agents such as N-β-(N-vinylbenzylaminoethyl)-γ-aminopropyltrimethoxysilane hydrochloride and phenylsilane coupling agents. The silane coupling agent can be used singly or at least two silane coupling agents can be used in combination, as required.

The resin composition of the present invention can further jointly contain a curing accelerator for adjusting a curing speed, as required. The curing accelerator is not specially limited so long as it is a general curing accelerator which is used as a curing accelerator for the vinyl compound (a), the naphthol aralkyl type cyanate ester resin (b), the bisphenol A cyanate ester resin (c) and a brominated epoxy resin. Specific examples of the curing accelerator include organic salts of metals such as copper, zinc, cobalt and nickel, imidazoles and derivatives thereof, tertiary amines and a radical polymerization initiator.

A cross-linking type curing agent can be further incorporated into the resin composition of the present invention, as required. The cross-linking type curing agent has an effect of increasing the fluidity of the resin composition and improving copper foil peel strength. In particular, a cross-linking type curing agent having good compatibility with a terminal vinyl compound of a bifunctional phenylene ether oligomer having a polyphenylene ether structure is preferably used. Specific examples of the cross-linking type curing agent include a polyfunctional vinyl compound such as divinylbenzene, divinylnaphthalene or divinylbiphenyl, a vinylbenzyl ether compound synthesized by a reaction between phenol and vinylbenzyl chloride, and an allyl ether compound synthesized by a reaction between a styrene monomer, phenol and allyl chloride. Further, trialkenyl isocyanurate is preferred. In particular, trialkenyl isocyanurate having good compatibility is preferable. Specifically, triallyl isocyanurate (TAIC) or triallyl cyanurate (TAC) is preferred since these are excellent in moldability and a laminate excellent in copper foil peel strength can be obtained.

A silane coupling agent can be further incorporated into the resin composition of the present invention, as required. The silane coupling agent is not specially limited so long as it is a general silane coupling agent. Specific example thereof include aminosilane coupling agents such as γ-aminopropyltriethoxysilane and N-β-(aminoethyl)-γ-aminopropyltrimethoxysilane, epoxysilane coupling agents such as γ-glycidoxypropyltrimethoxysilane, vinylsilane coupling agents such as γ-methacryloxypropyltrimethoxysilane, cationic silane coupling agents such as N-β-(N-vinylbenzylaminoethyl)-γ-aminopropyltrimethoxysilane hydrochloride and phenylsilane coupling agents. The silane coupling agent can be used singly or at least two silane coupling agents can be used in combination, as required.

A polymerization inhibitor can be further incorporated into the resin composition of the present invention in order to increase shelf life. A generally known polymerization inhibitor can be used as the above polymerization inhibitor. Examples of the polymerization inhibitor include quinones such as hydroquinone, methyl hydroquinone, p-benzoquinone, chloranil and trimethylquinone, aromatic diols, and di-t-butylhydroxytoluene.

The resin composition of the present invention can further contain a variety of high molecular weight compounds such as a different thermosetting resin, a thermoplastic resin and an oligomer thereof, and elastomers, a different flame retardant compound and an additive so long as the inherent properties of the resin composition are not impaired. The high molecular weight compounds, the flame retardant compound and the additive are not specially limited so long as they are selected from those which are generally used. Examples of the flame retardant compound include a bromine compound such as 4,4'-dibromobiphenyl, phosphoric acid ester, melamine phosphate, a phosphorus-containing epoxy resin, a nitrogen compound such as melamine or benzoguanamine, an oxazine-ring-containing compound and a silicone compound. Examples of the additive include an ultraviolet absorber, an antioxidant, a photopolymerization initiator, a fluorescent brightening agent, a photosensitizer, a dye, a pigment, a thickener, a lubricant, an antifoamer, a dispersing agent, a leveling agent and a brightener. These can be used in combination as required.

The resin composition of the present invention can be used in the form of a solution of the resin composition dissolved in an organic solvent, as required. The organic solvent is not specially limited so long as it is capable of dissolving a mixture of the vinyl compound (a), the naphthol aralkyl type cyanate ester resin (b), the bisphenol A cyanate ester resin (c) and the brominated flame retardant (d). Specific examples thereof include ketones such as acetone, methyl ethyl ketone and methyl isobutyl ketone; polar solvents such as dimethylacetamide and dimethylformamide; and aromatic hydrocarbon solvents such as toluene and xylene. The organic solvent can be used singly or a mixture of at least two organic solvents can be used in combination.

Examples of the glass woven fabric (f) used in the present invention includes woven fabrics of E glass, D glass, S glass, T glass, NE glass, quartz and liquid crystal polyester. The thickness of the glass woven fabric (f) is not specially limited. In terms of dimensional stability, a woven fabric having a thickness of 0.01 to 0.2 mm for use in a laminate is preferred and, in particular, a woven fabric which is subjected to super opening treatment or clogging treatment is preferred. Further, a glass woven fabric surface-treated with a silane-coupling agent such as epoxysilane or aminosilane is preferably used in terms of heat resistance after moisture absorption. A liquid crystal polyester woven fabric is preferably used in terms of electric characteristics.

The method of producing the prepreg of the present invention is not specially limited so long as the prepreg is produced by combining the above resin composition and the glass woven fabric (f). Specifically, a solution of the resin composition of the present invention is impregnated into the glass woven fabric (f) and the impregnated glass woven fabric is B-staged by drying, for instance, at 130 to 180° C. for approximately 3 to 20 minutes, to produce a prepreg having a resin amount of 30 to 90% by weight. The above resin amount includes the amount of the inorganic filler (e).

The metal-foil-clad laminate of the present invention is obtained by laminate-molding using the above prepreg. Specifically, a predetermined number of the above prepregs are stacked, a copper foil is disposed on one side or both sides of the stacked prepregs, the copper foil and the prepregs are laminate-molded, for instance, at a temperature of 180 to 220° C. for a heating time of 100 to 300 minutes under a surface pressure of 20 to 40 kg/cm², to obtain a copper-clad laminate. The thickness of the copper foil is not specially limited, while an electrolytic copper foil having a thickness of 3 to 35 μm is preferably used. The electrolytic copper foil is not specially limited so long as it is a general electrolytic copper foil for use in a laminate. An electrolytic copper foil having small mat surface roughness is preferred in consideration of a conductor loss in a high frequency region. Further, an example of the method of producing a multilayer board is explained hereinafter. For example, copper foils having a thickness of 35 μm each are disposed on both sides, one copper foil on each side, of one prepreg of the present invention, the copper foils and the prepreg are laminate-molded under the above conditions, then an inner layer circuit is formed and the circuit is subjected to blacking treatment, to form an inner layer circuit board. Such inner layer circuit boards and the prepregs of the present invention are one by one disposed alternatively, copper foils are disposed as outermost layers and the resultant set is laminate-molded under the above conditions, preferably in vacuum, to obtain a multilayer board.

The resin sheet of the present invention is obtained by applying the above solution of the resin composition to a base material and drying the applied solution. Then, the base material can be peeled off or etched as required. Examples of the base material include organic film base materials such as a polyethylene film, a polypropylene film, a polycarbonate film, a polyethylene terephthalate film, an ethylene tetrafluoroethylene copolymer film, a releasing film obtained by applying a releasing agent to the surface of any one of these films, and a polyimide film, conductive foils such as a copper foil and an aluminum foil, and plate-like base materials such as a glass plate, a SUS plate and FRP. The application method is typically a method in which the solution of the resin composition is applied to the base material with a bar coater, a die coater, a doctor blade, a baker applicator or the like and the solvent is removed by drying.

The drying conditions for the drying of the solvent are not specially limited. When the temperature for drying is low, the solvent is apt to remain in the resin composition. When the temperature is high, the resin composition undergoes curing. For these reasons, it is preferred that the solvent is dried at a temperature of 20° C. to 150° C. for 1 to 90 minutes. The thickness of the resin layer can be adjusted by the concentration of the resin composition solution and the thickness of the application of the resin composition solution. When the thickness of the application is large, the solvent is apt to remain at a drying time. For this reason, the thickness of the application is preferably 0.1 to 500 μm.

The resin composition of the present invention can be used as a material for an insulation layer of a printed wiring board and a material for a semiconductor package. For example, a solution of the curable resin composition of the present invention in a solvent is applied to a copper foil as a base material and the applied solution is dried, whereby a resin-attached copper foil can be obtained. Moreover, a solution of the curable resin composition of the present invention in a solvent is applied to a separable plastic film as a base material, followed by drying, whereby a film for buildup, a dry film solder resist or a die attach film can be obtained. The solvent can be dried by heating at a temperature of 20° C. to 150° C. for 1 to 90 minutes. Further, the curable resin composition can be used in an uncured state only after drying the solvent. Furthermore, the curable resin composition can be also used in a semi-cured state, as required.

EXAMPLES

The present invention will be concretely explained with reference to Examples and Comparative Examples, hereinafter, while the present invention shall not be limited to these.

Synthetic Example 1

(Synthesis of Bifunctional Phenylene Ether Oligomer)

9.36 g (42.1 mmol) of $CuBr_2$, 1.81 g (10.5 mmol) of N,N'-di-t-butylethylenediamine, 67.77 g (671.0 mmol) of n-butyldimethylamine and 2,600 g of toluene were charged into a longitudinally long reactor having a volume of 12 liters and equipped with a stirrer, a thermometer, an air-introducing tube and baffleplates. The mixture was stirred at a reaction temperature of 40° C. A mixed solution was obtained by dissolving 129.32 g (0.48 mol) of 2,2',3,3',5,5'-hexamethyl-(1,1'-biphenol)-4,4'-diol, 878.4 g (7.2 mol) of 2,6-dimethylphenol, 1.22 g (7.2 mmol) of N,N'-di-t-butylethylenediamine and 26.35 g (260.9 mmol) of n-butyldimethylamine in 2,300 g of methanol in advance. The mixed solution was dropwise added to the mixture in the reactor over 230 minutes with stirring while bubbling was carried out with a nitrogen-air mixed gas having an oxygen concentration of 8% at a flow rate of 5.2 L/min. After the completion of the addition, 1,500 g of water containing 48.06 g (126.4 mmol) of tetrasodium ethylenediamine tetraacetate dissolved therein was added to the stirred mixture to terminate the reaction. An aqueous layer and an organic layer were separated. Then, the organic layer was washed with 1N hydrochloric acid aqueous solution and then washed with pure water. The thus-obtained solution was concentrated to 50 wt % with an evaporator, to obtain 1,981 g of a toluene solution of a bifunctional phenylene ether oligomer compound (resin "A"). The resin "A" had a number average molecular weight of 1,975, a weight average molecular weight of 3,514 and a hydroxyl group equivalent of 990.

(Synthesis of Vinyl Compound)

833.40 g of the toluene solution of the resin "A", 76.7 g of vinylbenzyl chloride (trade name CMS-P; supplied by Seimi Chemical Co., Ltd.), 1,600 g of methylene chloride, 6.2 g of benzyldimethylamine, 199.5 g of pure water and 83.6 g of 30.5 wt % NaOH aqueous solution were charged into a reactor equipped with a stirrer, a thermometer and a reflux tube. The mixture was stirred at a reaction temperature of 40° C. The stirring was carried out for 24 hours. Then, an organic layer was washed with 1N hydrochloric acid aqueous solution and then washed with pure water. The thus-obtained solution was concentrated with an evaporator, and the concentrated solution was dropwise added to methanol to obtain a solid. The solid was recovered by filtering, and the recovered solid was dried in vacuum to obtain 450.1 g of a vinyl compound "B". The vinyl compound "B" had a number average molecular weight of 2,250, a weight average molecular weight of 3,920 and a vinyl group equivalent of 1,189 g/vinyl group.

Synthetic Example 2

(Synthesis of Bifunctional Phenylene Ether Oligomer)

3.88 g (17.4 mmol) of CuBr$_2$, 0.75 g (4.4 mmol) of N,N'-di-t-butylethylenediamine, 28.04 g (277.6 mmol) of n-butyldimethylamine and 2,600 g of toluene were charged into a longitudinally long reactor having a volume of 12 liters and equipped with a stirrer, a thermometer, an air-introducing tube and baffleplates. The mixture was stirred at a reaction temperature of 40° C. A mixed solution was obtained by dissolving 129.3 g (0.48 mol) of 2,2',3,3',5,5'-hexamethyl-(1,1'-biphenol)-4,4'-diol, 233.7 g (1.92 mol) of 2,6-dimethylphenol, 64.9 g (0.48 mol) of 2,3,6-trimethylphenol, 0.51 g (2.9 mmol) of N,N'-di-t-butylethylenediamine and 10.90 g (108.0 mmol) of n-butyldimethylamine in 2,300 g of methanol in advance. The mixed solution was dropwise added to the mixture in the reactor over 230 minutes with stirring while bubbling was carried out with a nitrogen-air mixed gas having an oxygen concentration of 8% at a flow rate of 5.2 L/min. After the completion of the addition, 1,500 g of water containing 19.89 g (52.3 mmol) of tetrasodium ethylenediamine tetraacetate dissolved therein was added to the stirred mixture to terminate the reaction. An aqueous layer and an organic layer were separated. The organic layer was washed with 1N hydrochloric acid aqueous solution and then washed with pure water. The thus-obtained solution was concentrated to 50 wt % with an evaporator, to obtain 836.5 g of a toluene solution of a bifunctional phenylene ether oligomer compound (resin "C"). The resin "C" had a number average molecular weight of 986, a weight average molecular weight of 1,530 and a hydroxyl group equivalent of 471.

(Synthesis of Vinyl Compound)

836.5 g of the toluene solution of the resin "C", 162.6 g of vinylbenzyl chloride (trade name CMS-P; supplied by Seimi Chemical Co., Ltd.), 1,600 g of methylene chloride, 12.95 g of benzyldimethylamine, 420 g of pure water and 178.0 g of 30.5 wt % NaOH aqueous solution were charged into a reactor equipped with a stirrer, a thermometer and a reflux tube. The mixture was stirred at a reaction temperature of 40° C. The stirring was carried out for 24 hours. Then, an organic layer was washed with 1N hydrochloric acid aqueous solution and then washed with pure water. The thus-obtained solution was concentrated with an evaporator, and the concentrated solution was dropwise added to methanol to obtain a solid. The solid was recovered by filtering, and the recovered solid was dried in vacuum to obtain 503.5 g of a vinyl compound "D". The vinyl compound "D" had a number average molecular weight of 1,187, a weight average molecular weight of 1,675 and a vinyl group equivalent of 590 g/vinyl group.

Synthetic Example 3

(Synthesis of α-Naphthol Aralkyl Type Cyanate Ester Resin)

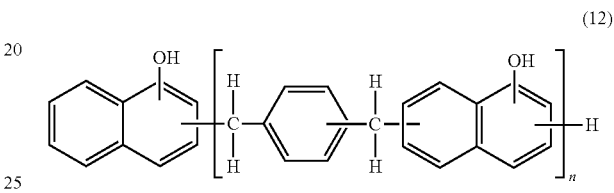

(12)

103 g (OH group 0.47 mol) of an α-naphthol aralkyl resin represented by the formula (12) (SN485, OH group equivalent: 219 g/eq., softening point: 86° C., supplied by Nippon Steel Chemical Co., Ltd.) was dissolved in 500 ml of chloroform. Then, 0.7 mol of triethylamine was mixed with the resultant solution. The mixture was dropwise added to 300 g of a chloroform solution of 0.93 mol of cyanogen chloride at −10° C. over 1.5 hours. The mixture was stirred for 30 minutes. Then, a mixed solution of 0.1 mol of triethylamine and 30 g of chloroform was dropwise added to the stirred mixture and the mixture was stirred for 30 minutes to complete the reaction. A hydrochloride of triethylamine generated was separated by filtering, to obtain a filtrate. The filtrate was washed with 500 ml of 0.1N hydrochloric acid and then washing with 500 ml of water was repeated four times. Then, a chloroform layer of the chloroform/water mixed solution was extracted by liquid-separation treatment. Sodium sulfate was added to the chloroform solution to carry out dehydration treatment. The sodium sulfate was separated by filtering. Then, the resultant solution was evaporated at 75° C. and then further deaerated under reduced pressure at 90° C., to obtain a blackish brown solid α-naphthol aralkyl type cyanate ester resin represented by the formula (13). Absorption of a cyanate ester group was confirmed around 2264 cm$^{-1}$ in an infrared absorption spectrum. Further, it was confirmed based on 13C-NMR and 1H-NMR that the conversion rate of from OH groups to OCN groups was 99% or higher.

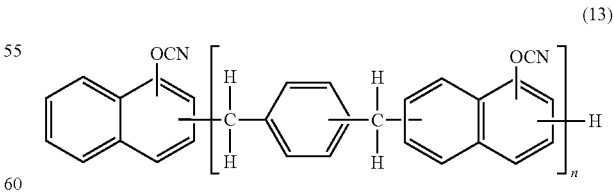

(13)

Synthetic Example 4

(Synthesis of α-Naphthol Aralkyl Type Cyanate Ester Resin)

An α-naphthol aralkyl type cyanate ester resin was synthesized in the same manner as in Synthetic Example 3 except that 103 g (OH group 0.47 mol) of the α-naphthol aralkyl resin (SN485, OH group equivalent: 219 g/eq., softening point: 86° C., supplied by Nippon Steel Chemical Co., Ltd.) was replaced with 102 g (OH group 0.45 mol) of an α-naphthol aralkyl resin (SN4105, OH group equivalent: 226 g/eq., softening point: 105° C., supplied by Nippon Steel Chemical Co., Ltd.) and that the amount of the cyanogen chloride was changed to 0.90 mol. The conversion rate of from OH groups to OCN groups was 99% or higher.

Example 1

70 parts by weight of the vinyl compound "D" (number average molecular weight 1,187, vinyl group equivalent 590 g/vinyl group) obtained in Synthetic Example 2, 10 parts by weight of the naphthol aralkyl type cyanate ester resin (cyanate equivalent: 244 g/eq.) obtained in Synthetic Example 4, 15 parts by weight of a brominated polycarbonate resin (FR53, bromine content 58%, supplied by Mitsubishi Gas Chemical Co., Inc.), 5 parts by weight of a bisphenol A cyanate ester resin (CA210, supplied by Mitsubishi Gas Chemical Co., Inc.), 50 parts by weight of a spherical silica (SC2050, average particle diameter 0.5 μm, supplied by Admatechs Company Limited) and 0.1 part by weight of di-t-butylhydroxytoluene (supplied by Kawaguchi Chemical Industry Co., LTD.) were mixed. The mixture was diluted with methyl ethyl ketone, to obtain a varnish having a resin solid content concentration of 65%. Table 1 shows the evaluation results of the shelf life of the varnish.

Example 2

70 parts by weight of the vinyl compound "D" (number average molecular weight 1,187, vinyl group equivalent 590 g/vinyl group) obtained in Synthetic Example 2, 10 parts by weight of the naphthol aralkyl type cyanate ester resin (cyanate equivalent: 244 g/eq.) obtained in Synthetic Example 4, 15 parts by weight of a brominated polycarbonate resin (FR53, bromine content 58%, supplied by Mitsubishi Gas Chemical Co., Inc.), 5 parts by weight of a bisphenol A cyanate ester resin (CA210, supplied by Mitsubishi Gas Chemical Co., Inc.) and 50 parts by weight of a spherical silica (SC2050, average particle diameter 0.5 μm, supplied by Admatechs Company Limited) were mixed. The mixture was diluted with methyl ethyl ketone, to obtain a varnish having a resin solid content concentration of 65%. Table 1 shows the evaluation results of the shelf life of the varnish. The varnish was impregnated into an E glass cloth having a thickness of 0.08 mm (IPC No.-#3313) and the varnish-impregnated glass cloth was dried under heat at 160° C. for 8 minutes, whereby eight prepregs having a resin amount of 55% by weight were obtained. These eight prepregs having a resin amount of 55% by weight were stacked. 18 μm copper foils (3EC-III, supplied by Mitsui Mining & Smelting Co., LTD.) were disposed on both sides of the stacked prepregs, one copper foil on each side. The copper foils and the prepregs were vacuum-pressed under a pressure of 30 kg/cm$^2$ at a temperature of 210° C. for 150 minutes, to obtain an 18 μm-copper-clad laminate having a thickness of 0.8 mm. Table 2 shows the values of physical properties of the copper-clad laminate.

Example 3

68 parts by weight of the vinyl compound "D" (number average molecular weight 1,187, vinyl group equivalent 590 g/vinyl group) obtained in Synthetic Example 2, 9 parts by weight of the naphthol aralkyl type cyanate ester resin (cyanate equivalent: 244 g/eq.) obtained in Synthetic Example 4, 12 parts by weight of a brominated polycarbonate resin (FR53, bromine content 58%, supplied by Mitsubishi Gas Chemical Co., Inc.), 4 parts by weight of a bisphenol A cyanate ester resin (CA210, supplied by Mitsubishi Gas Chemical Co., Inc.), 3 parts by weight of a brominated novolak type epoxy resin (BREN-S, bromine content 35.5%, supplied by Nippon Kayaku Co., Ltd.), 4 parts by weight of a brominated bisphenol A epoxy resin (1123P, bromine content 23%, supplied by DIC Corporation) and 50 parts by weight of a spherical silica (SC2050, average particle diameter 0.5 μm, supplied by Admatechs Company Limited) were diluted with methyl ethyl ketone, to obtain a varnish having a resin solid content concentration of 65%. A copper-clad laminate was obtained in the same manner as in Example 2 except that this varnish was used in place of the varnish used in Example 2. Table 2 shows the values of physical properties of the copper-clad laminate.

Example 4

68 parts by weight of the vinyl compound "B" (number average molecular weight 2,250, vinyl group equivalent 1,189 g/vinyl group) obtained in Synthetic Example 1, 9 parts by weight of the naphthol aralkyl type cyanate ester resin (cyanate equivalent: 244 g/eq.) obtained in Synthetic Example 4, 12 parts by weight of a brominated polycarbonate resin (FR53, bromine content 58%, supplied by Mitsubishi Gas Chemical Co., Inc.), 4 parts by weight of a bisphenol A cyanate ester resin (CA210, supplied by Mitsubishi Gas Chemical Co., Inc.), 3 parts by weight of a brominated novolak type epoxy resin (BREN-S, bromine content 35.5%, supplied by Nippon Kayaku Co., Ltd.), 4 parts by weight of a brominated bisphenol A epoxy resin (1123P, bromine content 23%, supplied by DIC Corporation) and 100 parts by weight of a spherical silica (SC2050, average particle diameter 0.5 μm, supplied by Admatechs Company Limited) were diluted with methyl ethyl ketone, to obtain a varnish having a resin solid content concentration of 65%. A copper-clad laminate was obtained in the same manner as in Example 2 except that this varnish was used in place of the varnish used in Example 2. Table 2 shows the values of physical properties of the copper-clad laminate.

Example 5

68 parts by weight of the vinyl compound "D" (number average molecular weight 1,187, vinyl group equivalent 590 g/vinyl group) obtained in Synthetic Example 2, 9 parts by weight of the naphthol aralkyl type cyanate ester resin (cyanate equivalent: 237 g/eq.) obtained in Synthetic Example 3, 12 parts by weight of a brominated polycarbonate resin (FR53, bromine content 58%, supplied by Mitsubishi Gas Chemical Co., Inc.), 4 parts by weight of a bisphenol A cyanate ester resin (CA210, supplied by Mitsubishi Gas Chemical Co., Inc.), 3 parts by weight of a brominated novolak type epoxy resin (BREN-S, bromine content 35.5%, supplied by Nippon Kayaku Co., Ltd.), 4 parts by weight of a brominated bisphenol A epoxy resin (1123P, bromine content 23%, supplied by DIC Corporation) and 50 parts by weight of a spherical silica (SC2050, average particle diameter 0.5 μm, supplied by Admatechs Company Limited) were diluted with methyl ethyl ketone, to obtain a varnish having a resin solid content concentration of 65%. A copper-clad laminate was obtained in the same manner as in Example 2 except that this varnish was used in place of the varnish used in Example 2. Table 2 shows the values of physical properties of the copper-clad laminate.

Example 6

68 parts by weight of the vinyl compound "D" (number average molecular weight 1,187, vinyl group equivalent 590 g/vinyl group) obtained in Synthetic Example 2, 4 parts by weight of the naphthol aralkyl type cyanate ester resin (cyanate equivalent: 244 g/eq.) obtained in Synthetic Example 4, 12 parts by weight of a brominated polycarbonate resin (FR53, bromine content 58%, supplied by Mitsubishi Gas Chemical Co., Inc.), 9 parts by weight of a bisphenol A cyanate ester resin (CA210, supplied by Mitsubishi Gas Chemical Co., Inc.), 3 parts by weight of a brominated novolak type epoxy resin (BREN-S, bromine content 35.5%, supplied by Nippon Kayaku Co., Ltd.), 4 parts by weight of a brominated bisphenol A epoxy resin (1123P, bromine content 23%, supplied by DIC Corporation) and 50 parts by weight of a spherical silica (SC2050, average particle diameter 0.5 μm, supplied by Admatechs Company Limited) were diluted with methyl ethyl ketone, to obtain a varnish having a resin solid content concentration of 65%. A copper-clad laminate was obtained in the same manner as in Example 2 except that this varnish was used in place of the varnish used in Example 2. Table 2 shows the values of physical properties of the copper-clad laminate.

Example 7

68 parts by weight of the vinyl compound "D" (number average molecular weight 1,187, vinyl group equivalent 590 g/vinyl group) obtained in Synthetic Example 2, 9 parts by weight of the naphthol aralkyl type cyanate ester resin (cyanate equivalent: 244 g/eq.) obtained in Synthetic Example 4, 12 parts by weight of a brominated polycarbonate resin (FR53, bromine content 58%, supplied by Mitsubishi Gas Chemical Co., Inc.), 4 parts by weight of a bisphenol A cyanate ester resin (CA210, supplied by Mitsubishi Gas Chemical Co., Inc.), 3 parts by weight of a brominated novolak type epoxy resin (BREN-S, bromine content 35.5%, supplied by Nippon Kayaku Co., Ltd.), 4 parts by weight of a brominated bisphenol A epoxy resin (1123P, bromine content 23%, supplied by DIC Corporation) and 50 parts by weight of a spherical silica (SC2050, average particle diameter 0.5 μm, supplied by Admatechs Company Limited) were diluted with methyl ethyl ketone, to obtain a varnish having a resin solid content concentration of 65%. The varnish was weighed and placed in a separable flask equipped with a stirrer. Methyl ethyl ketone was added to the varnish such that the concentration of a solid content became 20% by weight. The resultant mixture was heated to 60° C. and stirred for 1 hour, to prepare a solution of a resin composition. The so-obtained solution was stored in a cold insulation box at 5° C. for 2 weeks. Then, the solution was applied to a mat surface of an 18 μm electrolytic copper foil (3EC-HTE: supplied by Mitsui Mining & Smelting Co., LTD.) with a doctor blade (gap 200 μm). The applied solution was air-dried at room temperature for 10 minutes and then dried with an air blowing dryer at 50° C. for 20 minutes, whereby two copper-foil-attached resin sheets having a resin layer thickness of about 15 μm each were obtained. These two copper-foil-attached resin sheets were disposed on the upper and lower sides of an etched core material having a thickness of 0.8 mm (CCL-EL190T, supplied by Mitsubishi Gas Chemical Co., Inc.), one resin sheet on each side, and the resin sheets and the core material were vacuum-pressed under a pressure of 30 kg/cm² at a temperature of 210° C. for 150 minutes, whereby a resin-sheet-attached 18 μm-copper-clad laminate having a thickness of 0.85 mm was obtained. Table 2 shows the values of physical properties of the copper-clad laminate.

Comparative Example 1

70 parts by weight of the vinyl compound "D" (number average molecular weight 1,187, vinyl group equivalent 590 g/vinyl group) obtained in Synthetic Example 2, 15 parts by weight of the naphthol aralkyl type cyanate ester resin (cyanate equivalent: 244 g/eq.) obtained in Synthetic Example 4, 15 parts by weight of a brominated polycarbonate resin (FR53, bromine content 58%, supplied by Mitsubishi Gas Chemical Co., Inc.), and 50 parts by weight of a spherical silica (SC2050, average particle diameter 0.5 μm, supplied by Admatechs Company Limited) were mixed. The mixture was diluted with methyl ethyl ketone, to obtain a varnish having a resin solid content concentration of 65%. A copper-clad laminate was obtained in the same manner as in Example 2 except that this varnish was used in place of the varnish used in Example 2. Table 3 shows the values of physical properties of the copper-clad laminate.

Comparative Example 2

68 parts by weight of the vinyl compound "D" (number average molecular weight 1,187, vinyl group equivalent 590 g/vinyl group) obtained in Synthetic Example 2, 9 parts by weight of the naphthol aralkyl type cyanate ester resin (cyanate equivalent: 244 g/eq.) obtained in Synthetic Example 4, 12 parts by weight of a brominated polycarbonate resin (FR53, bromine content 58%, supplied by Mitsubishi Gas Chemical Co., Inc.), 4 parts by weight of a bisphenol M type cyanate ester resin (HF-7, supplied by Shanghai Huifeng Technical & Business Co., LTD), 3 parts by weight of a brominated novolak type epoxy resin (BREN-S, bromine content 35.5%, supplied by Nippon Kayaku Co., Ltd.), 4 parts by weight of a brominated bisphenol A epoxy resin (1123P, bromine content 23%, supplied by DIC Corporation) and 50 parts by weight of a spherical silica (SC2050, average particle diameter 0.5 μm, supplied by Admatechs Company Limited) were diluted with methyl ethyl ketone, to obtain a varnish having a resin solid content concentration of 65%. A copper-clad laminate was obtained in the same manner as in Example 2 except that this varnish was used in place of the varnish used in Example 2. Table 3 shows the values of physical properties of the copper-clad laminate.

Comparative Example 3

68 parts by weight of the vinyl compound "D" (number average molecular weight 1,187, vinyl group equivalent 590 g/vinyl group) obtained in Synthetic Example 2, 9 parts by weight of the naphthol aralkyl type cyanate ester resin (cyanate equivalent: 244 g/eq.) obtained in Synthetic Example 4, 12 parts by weight of a brominated polycarbonate resin (FR53, bromine content 58%, supplied by Mitsubishi Gas Chemical Co., Inc.), 4 parts by weight of a dicyclopentadiene type cyanate ester resin (HF-3, supplied by Shanghai Huifeng Technical & Business Co., LTD), 3 parts by weight of a brominated novolak type epoxy resin (BREN-S, bromine content 35.5%, suppliedbyNippon Kayaku Co., Ltd.), 4 parts by weight of a brominated bisphenol A epoxy resin (1123P, bromine content 23%, supplied by DIC Corporation) and 50 parts by weight of a spherical silica (SC2050, average particle diameter 0.5 μm, supplied by Admatechs Company Limited) were diluted with methyl ethyl ketone, to obtain a varnish having a resin solid content concentration of 65%. A copper-clad laminate was obtained in the same manner as in Example 2 except that this varnish was used in place of the varnish used in Example 2. Table 3 shows the values of physical properties of the copper-clad laminate.

Comparative Example 4

68 parts by weight of the vinyl compound "D" (number average molecular weight 1,187, vinyl group equivalent 590 g/vinyl group) obtained in Synthetic Example 2, 9 parts by weight of the naphthol aralkyl type cyanate ester resin (cyanate equivalent: 244 g/eq.) obtained in Synthetic Example 4, 12 parts by weight of a brominated polycarbonate resin (FR53, bromine content 58%, supplied by Mitsubishi Gas Chemical Co., Inc.), 4 parts by weight of a phenol novolak type cyanate ester resin (PT-30, supplied by LONZA Co., LTD), 3 parts by weight of a brominated novolak type epoxy resin (BREN-S, bromine content 35.5%, supplied by Nippon Kayaku Co., Ltd.), 4 parts by weight of a brominated bisphenol A epoxy resin (1123P, bromine content 23%, supplied by DIC Corporation) and 50 parts by weight of a spherical silica (SC2050, average particle diameter 0.5 μm, supplied by Admatechs Company Limited) were diluted with methyl ethyl ketone, to obtain a varnish having a resin solid content concentration of 65%. A copper-clad laminate was obtained in the same manner as in Example 2 except that this varnish was used in place of the varnish used in Example 2. Table 3 shows the values of physical properties of the copper-clad laminate.

Comparative Example 5

66 parts by weight of the vinyl compound "D" (number average molecular weight 1,187, vinyl group equivalent 590 g/vinyl group) obtained in Synthetic Example 2, 12 parts by weight of a brominated polycarbonate resin (FR53, bromine content 58%, supplied by Mitsubishi Gas Chemical Co., Inc.), 15 parts by weight of a bisphenol A cyanate ester resin (CA210, supplied by Mitsubishi Gas Chemical Co., Inc.), 3 parts by weight of a brominated novolak type epoxy resin (BREN-S, bromine content 35.5%, supplied by Nippon Kayaku Co., Ltd.), 4 parts by weight of a brominated bisphenol A epoxy resin (1123P, bromine content 23%, supplied by DIC Corporation) and 50 parts by weight of a spherical silica (SC2050, average particle diameter 0.5 μm, supplied by Admatechs Company Limited) were diluted with methyl ethyl ketone, to obtain a varnish having a resin solid content concentration of 65%. A copper-clad laminate was obtained in the same manner as in Example 2 except that this varnish was used in place of the varnish used in Example 2. Table 3 shows the values of physical properties of the copper-clad laminate.

Comparative Example 6

66 parts by weight of the vinyl compound "D" (number average molecular weight 1,187, vinyl group equivalent 590 g/vinyl group) obtained in Synthetic Example 2, 15 parts by weight of a bisphenol M type cyanate ester resin (HF-7, supplied by Shanghai Huifeng Technical & Business Co., LTD), 12 parts by weight of a brominated polycarbonate resin (FR53, bromine content 58%, supplied by Mitsubishi Gas Chemical Co., Inc.), 3 parts by weight of a brominated novolak type epoxy resin (BREN-S, bromine content 35.5%, supplied by Nippon Kayaku Co., Ltd.), 4 parts by weight of a brominated bisphenol A epoxy resin (1123P, bromine content 23%, supplied by DIC Corporation) and 50 parts by weight of a spherical silica (SC2050, average particle diameter 0.5 μm, supplied by Admatechs Company Limited) were diluted with methyl ethyl ketone, to obtain a varnish having a resin solid content concentration of 65%. A copper-clad laminate was obtained in the same manner as in Example 2 except that this varnish was used in place of the varnish used in Example 2. Table 3 shows the values of physical properties of the copper-clad laminate.

Comparative Example 7

68 parts by weight of the vinyl compound "D" (number average molecular weight 1,187, vinyl group equivalent 590 g/vinyl group) obtained in Synthetic Example 2, 4 parts by weight of a dicyclopentadiene type cyanate ester resin (HF-3, supplied by Shanghai Huifeng Technical & Business Co., LTD), 9 parts by weight of a bisphenol A cyanate ester resin (CA210, supplied by Mitsubishi Gas Chemical Co., Inc.), 12 parts by weight of a brominated polycarbonate resin (FR53, bromine content 58%, supplied by Mitsubishi Gas Chemical Co., Inc.), 3 parts by weight of a brominated novolak type epoxy resin (BREN-S, bromine content 35.5%, supplied by Nippon Kayaku Co., Ltd.), 4 parts by weight of a brominated bisphenol A epoxy resin (1123P, bromine content 23%, supplied by DIC Corporation) and 50 parts by weight of a spherical silica (SC2050, average particle diameter 0.5 μm, supplied by Admatechs Company Limited) were diluted with methyl ethyl ketone, to obtain a varnish having a resin solid content concentration of 65%. A copper-clad laminate was obtained in the same manner as in Example 2 except that this varnish was used in place of the varnish used in Example 2. Table 3 shows the values of physical properties of the copper-clad laminate.

TABLE 1

| Shelf life of varnish | | Example 1 | Example 2 |
| --- | --- | --- | --- |
| Generation of high molecular weight compound | Immediately after preparation | No | No |
| | After 4 weeks | No | Yes |

TABLE 2

| Evaluation results of copper-clad laminate | Ex. 2 | Ex. 3 | Ex. 4 | Ex. 5 | Ex. 6 | Ex. 7 |
| --- | --- | --- | --- | --- | --- | --- |
| Moldability (resin flow) (Spec: >5 mm) | ◯ | ◯ | ◯ | ◯ | ◯ | ◯ |
| Flame retardancy (UL94) | V-0 | V-0 | V-0 | V-0 | V-0 | V-0 |

TABLE 2-continued

| Evaluation results of copper-clad laminate | Ex. 2 | Ex. 3 | Ex. 4 | Ex. 5 | Ex. 6 | Ex. 7 |
|---|---|---|---|---|---|---|
| Dielectric loss tangent (10 GHz) | 0.0052 | 0.0051 | 0.0050 | 0.0052 | 0.0054 | Not measured |
| Peel strength (Spec.: >0.7 kg/cm) | ○ | ○ | ○ | ○ | ○ | ○ |
| Heat resistance after moisture absorption PCT-3 hours 260° C./30 second immersion | ○○○○ | ○○○○ | ○○○○ | ○○○○ | ○○○○ | ○○○○ |

Ex. = Example

TABLE 3

| Evaluation results of copper-clad laminate | CEx. 1 | CEx. 2 | CEx. 3 | CEx. 4 | CEx. 5 | CEx. 6 | CEx. 7 |
|---|---|---|---|---|---|---|---|
| Moldability (resin flow) (Spec: >5 mm) | ○ | ○ | ○ | X | X | ○ | X |
| Flame retardancy (UL94) | V-0 | V-0 | V-0 | V-0 | V-0 | V-0 | V-0 |
| Dielectric loss tangent (10 GHz) | 0.0051 | 0.0051 | 0.0048 | 0.0061 | 0.0055 | 0.0050 | 0.0054 |
| Peel strength (Spec.: >0.7 kg/cm) | X | X | X | X | ○ | X | ○ |
| Heat resistance after moisture absorption PCT-3 hours 260° C./30 second immersion | ○XXX | ○XXX | ○○XX | ○XXX | ○○○○ | ○XXX | ○XXX |

CEx. = Comparative Example (Measurement Methods)

1) A number average molecular weight and a weight average molecular weight were obtained by a gel permeation chromatography (GPC) method. Data processing was carried out based on the GPC curve and molecular weight calibration curve of a sample. The molecular weight calibration curve was obtained by making an approximation of a relation between the molecular weight of a standard polystyrene and an elution time with the following equation, Log $M=A_0X^3+A_1X^2+A_2X+A_3+A_4/X^2$, wherein M is a molecular weight, X is an elution time−19 (minute) and A is a coefficient.

2) A hydroxyl group equivalent was determined from an absorption intensity at 3,600 cm$^{-1}$ in an IR analysis (solution cell method; cell thickness=1 mm) in which 2,6-dimethylphenol was used as a standard reference material and dry dichloromethane was used as a solvent.

3) A vinyl group equivalent was determined from an absorption intensity at 910 cm$^{-1}$ in an IR analysis (solution cell method; cell thickness=1 mm) in which 1-octene was used as a standard reference material and carbon disulfide was used as a solvent.

4) A cyanate equivalent was determined by confirming the absorption of a cyanate ester group around 2264 cm$^{-1}$ in an infrared absorption spectrum, then identifying a structure by 13C-NMR and 1H-NMR, measuring a conversion rate of from OH groups into OCN groups and calculating, on the basis of the conversion rate, the cyanate equivalent from the OH equivalent of a naphthol aralkyl resin used for evaluation.

5) Shelf Life of Varnish

A varnish was measured by a GPC method immediately after its preparation and after leaving the varnish to stand for 4 weeks at room temperature (25° C.). "Yes" represents that a peak showing the generation of a high molecular weight compound appeared in a chart. "No" represents that a peak showing the generation of a high molecular weight compound did not appear.

6) Moldability (Resin Flow)

After press molding, the maximum length among the lengths of resin flows, which flowed out from four edge sides, was measured with a scale. "○" (passing) represents that the above length was at least 5 mm. "×" (not passing) represents that the above length was less than 5 mm.

7) Peel Strength

An 18 μm-copper-foil-attached specimen (30 mm×150 mm×0.8 mm) was measured for the peel strength of a copper foil two times in conformity with JIS C6481 and an average value was obtained from these two measurements. "○" (passing) represents that the average value was at least 0.7 kg/cm. "×" (not passing) represents that the average value was less than 0.7 kg/cm. (n=2).

8) Dielectric Loss Tangent

A copper foil was removed from a copper-clad laminate having a thickness of 0.8 mm, to prepare a specimen. The specimen was measured for a dielectric loss tangent at 10 GHz by a cavity resonator perturbation method (Agilent 8722ES, supplied by Agilent technologies). (n=1).

9) Heat Resistance After Moisture Absorption

A copper foil of an 18 μm-copper-foil-attached laminate having a thickness of about 0.8 mm was etched to prepare a 5 cm×5 cm sample (n=4). The sample was dried at 115° C. for 20 hours. Then, the sample was treated with a pressure cooker tester (supplied by Hirayama Manufacturing Corporation, PC-3 type) at 121° C. at 2 atmospheric pressure for 3 hours. Then, the sample was immersed in a solder bath at 260° C. for 30 seconds. The sample was observed for the presence or absence of swelling by visual observation. "○" represents no defect. "×" represents the occurrence of swelling.

10) Flame Retardancy

Measured in conformity with a UL94 vertical test method (n=5).

From the above results, it is found that moldability, peel strength and heat resistance after moisture absorption can be well-balanced and satisfied owing to the combinational use of two kinds of specific cyanate ester resins, i.e., the naphthol aralkyl type cyanate ester resin and the bisphenol A cyanate ester resin, in the resin composition of the present invention. With regard to Comparative Examples 1, 5 and 6 where only one kind of cyanate ester resin, including the above two kinds of cyanate ester resins, was contained and Comparative Examples 2, 3, 4 and 7 where a combination of two kinds of cyanate ester resins other than the above combination of the above two kinds of cyanate ester resins was contained, it is found that at least one of moldability, peel strength and heat resistance after moisture absorption was inferior.

What is claimed is:

1. A resin composition comprising:
    a vinyl compound (a) represented by the formula (1) in an amount of 50 to 80 parts by weight based on 100 parts by weight of a resin solid content in the resin composition,
    a naphthol aralkyl cyanate ester resin (b) represented by the formula (5) in an amount of 3 to 10 parts by weight based on 100 parts by weight of a resin solid content in the resin composition,
    a bisphenol A cyanate ester resin (c) in an amount of 3 to 10 parts by weight based on 100 parts by weight of a resin solid content in the resin composition,
    a brominated flame retardant (d) comprising a brominated polycarbonate resin oligomer, a brominated novolak epoxy resin and a brominated bisphenol A epoxy resin in a total amount of 5 to 35 parts by weight based on 100 parts by weight of a resin solid content in the resin composition, and
    an inorganic filler (e) in an amount of 10 to 150 parts by weight based on 100 parts by weight of a resin solid content in the resin composition,

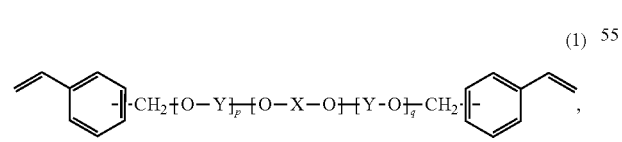
(1)

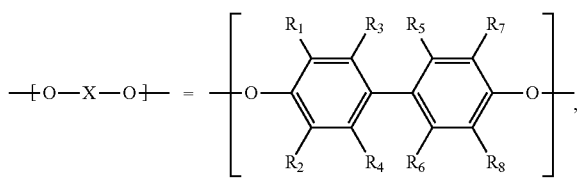
(2)

wherein $R_1$, $R_2$, $R_3$, $R_7$ and $R_8$ are the same or different and represent a halogen atom, an alkyl group having 6 or less carbon atoms or a phenyl group, and $R_4$, $R_5$ and $R_6$ are the same or different and represent a hydrogen atom, a halogen atom, an alkyl group having 6 or less carbon atoms or a phenyl group,

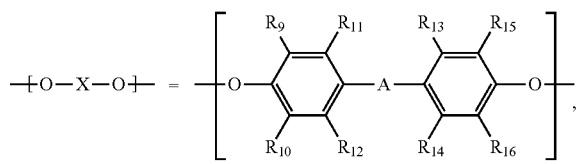
(3)

wherein $R_9$, $R_{10}$, $R_{11}$, $R_{12}$, $R_{13}$, $R_{14}$, $R_{15}$ and $R_{16}$ are the same or different and represent a hydrogen atom, a halogen atom, an alkyl group having 6 or less carbon atoms or a phenyl group and -A- represents a linear, branched or cyclic bivalent hydrocarbon group having 20 or less carbon atoms,

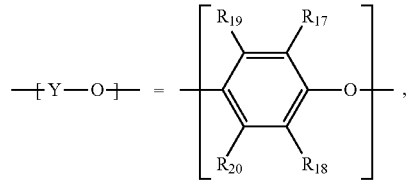
(4)

wherein $R_{17}$ and $R_{18}$ are the same or different and represent a halogen atom, an alkyl group having 6 or less carbon atoms or a phenyl group, and $R_{19}$ and $R_{20}$ are the same or different and represent a hydrogen atom, a halogen atom, an alkyl group having 6 or less carbon atoms or a phenyl group,

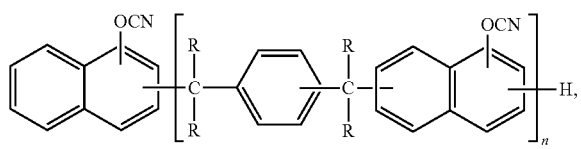
(5)

wherein —(O—X—O)— represents a structural unit of the formula (2) or (3), —(Y—O)— is an arrangement of a structural unit of the formula (4) or a random arrangement of at least two kinds of structural units of the formula (4), and each of p and q is an integer of 0 to 100, provided that at least one of p and q is not 0, wherein R represents a hydrogen atom or a methyl group and n is 1 to 10 as an average value, and wherein the resin composition exhibits superior results when compared to an identical resin composition that does not contain the naphthol aralkyl cyanate ester resin (b) represented by formula (5) or the bisphenol A cyanate ester resin (c).

2. The resin composition according to claim 1, wherein, in the vinyl compound (a), —(O—X—O)— is a structural unit of the formula (6), the formula (7) or the formula (8), and —(Y—O)— is an arrangement of a structural unit of the formula (9) or the formula (10) or a random arrangement of structural units of the formula (9) and the formula (10),

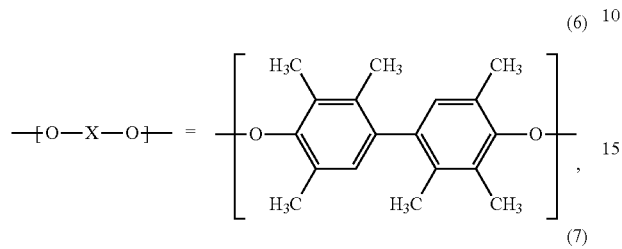

(6)

(7)

wherein $R_{11}$, $R_{12}$, $R_{13}$ and $R_{14}$ are the same or different and represent a hydrogen atom or a methyl group and -A- represents a linear, branched or cyclic bivalent hydrocarbon group having 20 or less carbon atoms,

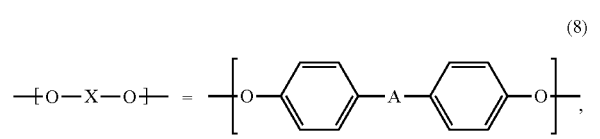

(8)

wherein -A- represents a linear, branched or cyclic bivalent hydrocarbon group having 20 or less carbon atoms,

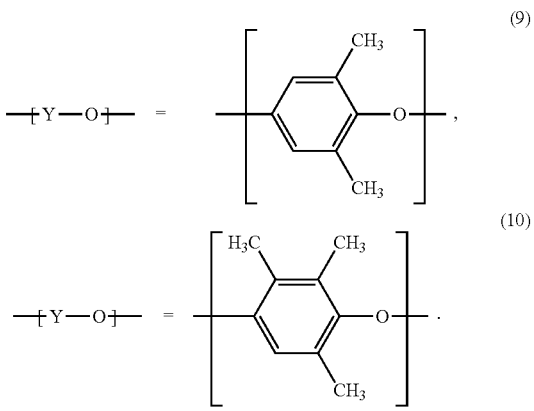

(9)

(10)

3. A prepreg comprising the resin composition as defined in claim 1 and a glass woven fabric (f).

4. A metal-foil-clad laminate obtained by placing one prepreg as defined in claim 3 or stacking at least two prepregs as defined in claim 3, disposing a metal foil on one side or both sides of the prepreg or the stacked prepregs and laminate-molding the metal foil and the prepreg or the stacked prepregs.

5. A resin sheet obtained by applying a solution of the resin composition as defined in claim 1 to a surface of a metal foil or a film and drying the applied solution.

6. The resin composition according to claim 1, further comprising a cross-linking curing agent selected from the group consisting of triallyl isocyanurate and triallyl cyanurate.

7. A printed wiring board having an insulation layer comprising the resin composition according to claim 1.

* * * * *